(12) United States Patent
Conder et al.

(10) Patent No.: US 6,489,179 B2
(45) Date of Patent: Dec. 3, 2002

(54) PROCESS FOR FABRICATING A CHARGE COUPLED DEVICE

(75) Inventors: Alan D. Conder, Tracy, CA (US); Bruce K. F. Young, Livermore, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/246,570

(22) Filed: Feb. 8, 1999

(65) Prior Publication Data

US 2002/0155636 A1 Oct. 24, 2002

Related U.S. Application Data

(62) Division of application No. 08/637,981, filed on Apr. 26, 1996.

(51) Int. Cl.[7] ............................................. H01L 21/00
(52) U.S. Cl. ..................... 438/60; 438/626; 438/631; 257/243; 257/236; 257/239
(58) Field of Search .................... 438/60, 626, 631; 257/243, 236, 239

(56) References Cited

U.S. PATENT DOCUMENTS

| 4,327,475 A | * | 5/1982 | Asai et al. ..................... 29/571 |
|---|---|---|---|
| 4,482,907 A | * | 11/1984 | Jay ............................... 357/22 |
| 4,617,586 A | * | 10/1986 | Cuvilliers et al. ............. 357/80 |
| 5,029,321 A | * | 7/1991 | Kimura ........................ 357/24 |
| 5,055,900 A | * | 10/1991 | Fossum et al. .............. 257/243 |
| 5,400,210 A | * | 3/1995 | Sugimoto et al. ......... 361/321.5 |
| 5,495,395 A | * | 2/1996 | Yoneda et al. ............... 361/769 |

* cited by examiner

Primary Examiner—Carl Whitehead, Jr.
Assistant Examiner—Khanh B. Duong
(74) Attorney, Agent, or Firm—L. E. Carnahan; Alan H. Thompson

(57) ABSTRACT

A monolithic three dimensional charged coupled device (3D-CCD) which utilizes the entire bulk of the semiconductor for charge generation, storage, and transfer. The 3D-CCD provides a vast improvement of current CCD architectures that use only the surface of the semiconductor substrate. The 3D-CCD is capable of developing a strong E-field throughout the depth of the semiconductor by using deep (buried) parallel (bulk) electrodes in the substrate material. Using backside illumination, the 3D-CCD architecture enables a single device to image photon energies from the visible, to the ultra-violet and soft x-ray, and out to higher energy x-rays of 30 keV and beyond. The buried or bulk electrodes are electrically connected to the surface electrodes, and an E-field parallel to the surface is established with the pixel in which the bulk electrodes are located. This E-field attracts charge to the bulk electrodes independent of depth and confines it within the pixel in which it is generated. Charge diffusion is greatly reduced because the E-field is strong due to the proximity of the bulk electrodes.

16 Claims, 9 Drawing Sheets

PROCESS FOR FABRICATING A CHARGE COUPLED DEVICE

This a division of application Ser. No. 08/637,981, filed Apr. 26, 1996.

The United States Government has rights in this invention pursuant to Contract No. W-7405-ENG48 between the United States Department of Energy and the University of California for the operation of Lawrence Livermore National Laboratory.

BACKGROUND OF THE INVENTION

The present invention relates to charge coupled devices, particularly to a process for forming buried electrodes, and more particularly to a three dimensional charged coupled device using buried electrodes which produce increased spectral range and has thick substrate back illumination, large full well and dynamic range capabilities, and radiation tolerance.

Charge coupled devices (CCD) were initially developed for an electrical analog to magnetic bubble memory. See Boyle et al., "Charge Coupled Semiconductor Devices", Bell Syst. Tech. Jour. 49, 593–600 (1970). Their analog charge handling capability made them useful in applications other than digital memory storage. Since their development, CCDs have been used to build analog delay lines, transversal filters, Fourier correlators, and signal processors. However, the greatest success has been their use as solid-state image sensors.

CCDs consist of closely spaced metal-oxide-semiconductor (MOS) capacitors located on the surface of a semiconductor. With appropriate dopant concentrations and capacitor electrode voltages, a space charge region is formed within the semiconductor directly below the surface of the MOS capacitor. This space charge region generates a potential well that stores charge generated with the material. This charge is generated by a variety of sources, from thermal electrons to injection via the photoelectric effect from photons that are absorbed within the semiconductor. When the voltages of the top electrodes of the MOS capacitors are pulsed in proper sequence, the potential wells move, transporting the stored charge from one MOS capacitor to the next. In this way the CCD becomes an image sensor capable of detecting, storing, and transporting charge generated by incident photons. This powerful concept has not changed over the past decades and the architecture used to implement this concept has changed very little.

CCDs are now being used in a wide range of image sensing applications, requiring different CCD topologies. The standard front illuminated CCD, see FIG. 1A, is useful for image sensing in the visible photon energy spectrum and recently in the 1–5 keV x-ray regime. These devices find use in video camera systems and facsimile and image reproduction equipment. Unfortunately this CCD architecture cannot be used in a variety of scientific and industrial applications which require imaging in the blue, ultra-violet, and soft x-ray energy spectrum. This is due to the fact that photons within these spectra are absorbed at the top electrode layer, which is no longer transparent at these energies.

To overcome this problem, a thinned, back illuminated CCD was introduced, see FIG. 1B. See "Thinned, Back Illuminated CCDs for Short Wavelength Applications", Tektronix Tech. Note July (1991). The problem of electrode absorption is overcome by turning the CCD upside-down and illuminating the backside of the substrate material. Unfortunately, the E-field generated by the topside electrodes is not strong enough to reach through to the backside of a standard device, as shown in FIG. 1A. Therefore, the substrate material is thinned from the backside until the E-field can reach through, typically 10–20 $\mu$m (see FIG. 1B). Though high quality thinned, back illuminated devices are fabricated in this manner they are expensive and extremely fragile.

Image sensing and photon counting at higher x-ray energies from 1 keV to 30 keV, is an expanding market for CCDs. See Flint, "CCD X-ray Detection", EEV Tech Note November (1991). To provide this energy range, CCDs are being developed using a thick epitaxial, deep depletion layer or region with a relatively thin substrate, see FIG. 1C. Unfortunately, there is still a problem of collecting charge deep from within the substrate, generated by the high energy x-ray photons. A 100 $\mu$m to 300 $\mu$m thick, high resistivity epitaxial layer is required to extend the E-field into the semiconductor. Yet such epitaxial layers are difficult to fabricate, see Flint supra, and the E-field at these depths is still too weak to overcome any lateral movement of the generated charge caused by diffusion. These devices also suffer from charge spreading at higher photon energies. The charge will drift towards the semiconductor surface at an angle dependent upon its diffusion direction. Eventually the charge will be captured by the strong E-field near the surface, though this may occur several pixels away from its point of origin. The result is a loss of resolution caused by this charge spreading phenomena.

The problems outlined above are overcome by the present invention, a three dimensional CCD (3D-CCD) capable of developing a strong E-field throughout the depth of the semiconductor by using deep (buried) parallel (bulk) electrodes in the substrate material. Using backside illumination, the 3D-CCD architecture enables a single device to image photon energies from the visible, to the ultra-violet and soft x-ray, and out to higher energy x-rays of 30 keV and beyond. In the 3D-CCD, charge is transferred from bulk electrode to bulk electrode within the body of the substrate using bulk mode operation. This mode of charge transport within a semiconductor is ideal since the charge never comes in contact with charge traps located at the surface. See White, "Charge Transport Without Traps", Solid State Imaging, Proceedings of the NATO Advanced Study Institute on Solid State Imaging, pp. 275–294, September (1975). Thus, the 3D-CCD of this invention uses the entire bulk of the semiconductor for charge generation, storage, and transfer, and thus is a vast improvement over current CCD architectures that primarily use only the surface of the semiconductor substrate.

SUMMARY OF THE INVENTION

It is an object of this invention to provide a charge coupled device that uses the entire bulk of the semiconductor for charge generation, storage, and transfer.

A further object of the invention is to provide a three dimensional charge coupled device (3D-CCD) which utilizes deep (buried) parallel electrodes in the substrate material.

A further object of the invention is to provide a process for fabricating deep (buried) electrodes to create a 3D-CCD.

Another object of the invention is to provide a 3D-CCD capable of developing a strong E-field throughout the depth of the semiconductor material by using deep parallel electrodes in the material.

Another object of the invention is to provide a 3D-CCD which can image photon energies from the visible, to the ultra-violet and soft x-ray, out to higher energy x-rays of 30 keV and beyond.

Another object of the invention is to provide a 3D-CCD wherein deep parallel bulk electrodes are electrically connected to the surface electrodes, and an E-field parallel to the surface is established within the pixel.

Another object of the invention is to provide a 3D-CCD using deep parallel bulk electrodes, and wherein the E-field attracts charge to the bulk electrodes independent of depth, and confines it within the pixel in which it is generated, whereby charge diffusion is greatly reduced.

Another object of the invention is to provide a 3D-CCD fabrication process which includes utilizing chemical and/or plasma etching to form deep parallel electrodes in the substrate material.

Other objects and advantages of the present invention will become apparent from the following description and accompanying drawings. The invention is a new structure for CCDs which involves monolithic three dimensional 3D-CCD and a process for forming electrode structures within the bulk of a semiconductor. By use of chemical and/or plasma etching of the semiconductor materials, such as silicon (Si), the 3D-CCD structures use the entire bulk of the semiconductor material for charge generation, storage, and transfer due to the deep (buried) electrodes. Thus, the 3D-CCD of this invention provides a vast improvement over current CCD structures that primarily use only the surface of the semiconductor material or substrate. The 3D-CCD offers imaging capabilities for industrial, scientific, and military uses by greatly improving the performance of the CCD architecture or structures. Specific advantages of the 3D-CCD, when used as an image sensor, includes: 1) a very wide spectral response, 2) a very large full well capacity, 3) a very large signal to noise ratio, and 4) a high tolerance to radiation damage (built in antiblooming). The 3D-CCD utilizes deep (buried) parallel bulk electrodes which are formed in the substrate or semiconductor material. These deep bulk electrodes are electrically connected to the surface electrodes, and an E-field parallel to the surface is established. with the pixel, which for example includes four (4) deep parallel electrodes. This E-field attracts charge to the bulk electrodes independent of depth, and confines it within the pixel in which it was generated. Charge diffusion is greatly reduced because the E-field is strong due to the proximity of the bulk electrodes. Using backside illumination, the 3D-CCD structure enables a single device to image photon energies from the visible, to the ultra-violet and soft x-rays, and out to high energy x-rays of 30 keV and beyond. The operation of the 3D-CCD is similar to that of standard CCDs. There is no special voltage or clock waveform requirements, and the principles of charge transfer and storage are identical. In the 3D-CCD, charge is transferred from bulk or buried electrode to bulk or buried electrode within the body of the substrate using bulk mode operation. This mode of charge transport within a semiconductor is ideal since the charge never comes in contact with charge traps located at the surface. See White, referenced above.

Fabrication of the 3D-CCD basically involves forming an array of holes in a substrate where the bulk electrodes are to be formed, whereafter the surfaces or walls of the holes are doped and metalized, thereby bulk electrodes are formed in the substrate, and may for example have a diameter of 10 $\mu$m and a depth of 200 $\mu$m. From this point the formation of surface electrode placement is carried out using standard techniques to form the surface electrode structure and active output devices as in a standard CCD fabrication process.

BRIEF DESCRIPTION OF THE DRAWINGS

The accompanying drawings, which are incorporated into and form a part of the disclosure, illustrate the prior art and an embodiment of the invention and, together with the description, serve to explain the principles of the invention.

DETAILED DESCRIPTION OF THE INVENTION

Figure 1A:
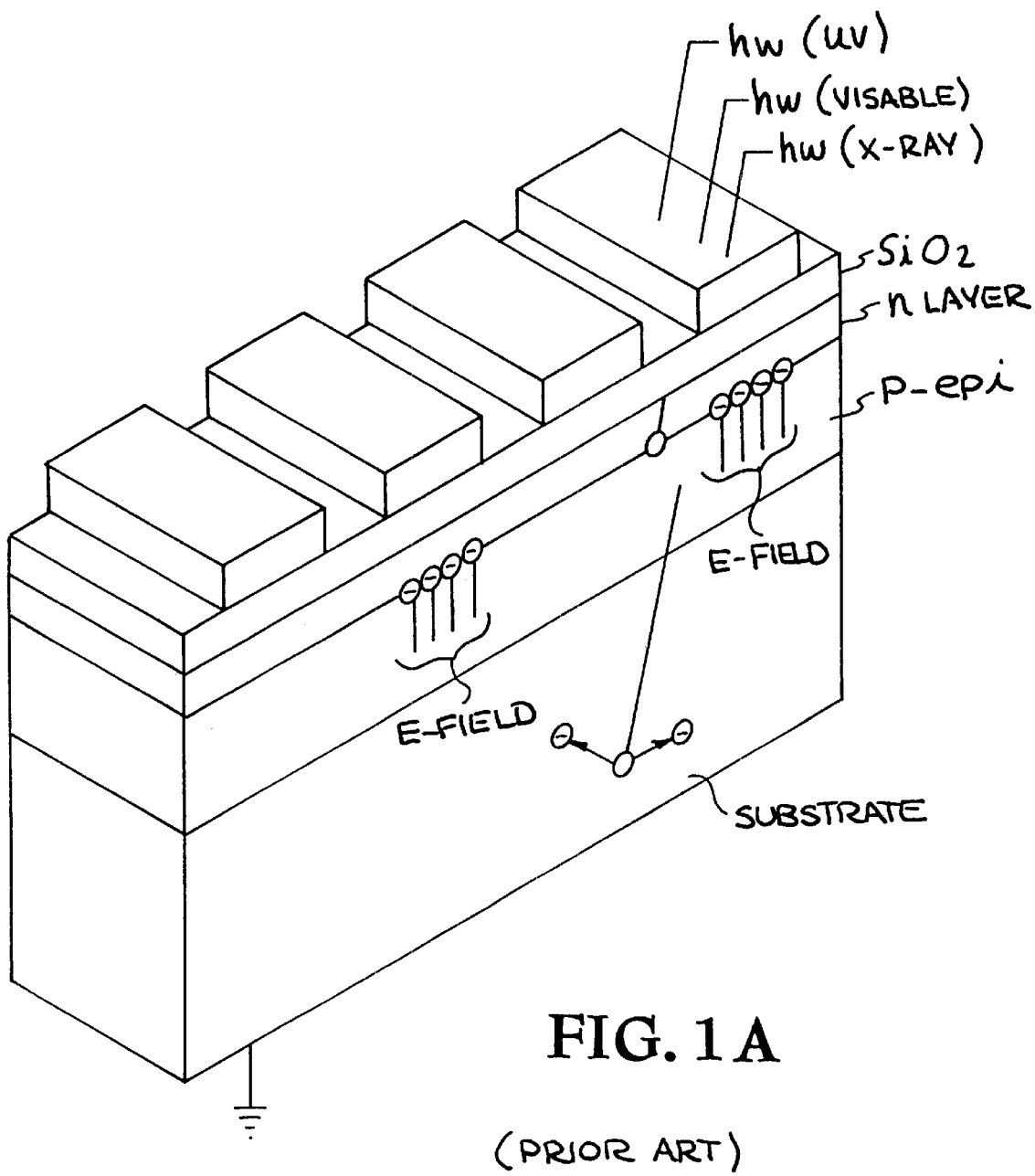
FIGS. 1A, 1B, and 1C illustrate prior art CCD structures.
Figure 1B:
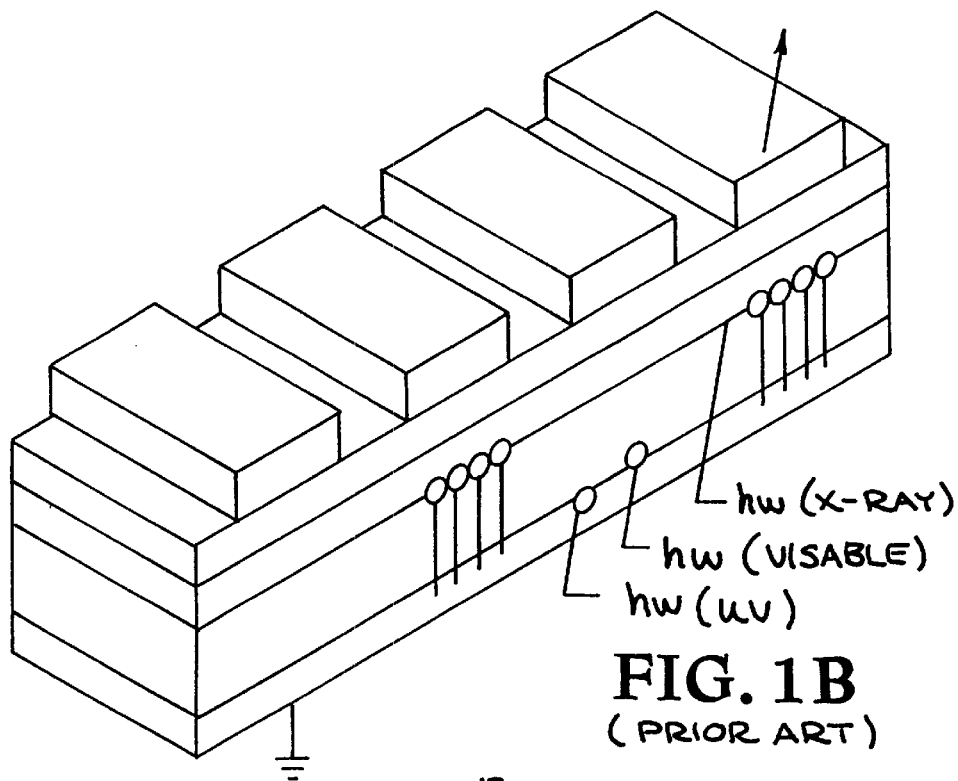

The invention is directed to a three dimensional charge couple device (3D-CCD). By a process in accordance with this invention, and the use of chemical and plasma etching of semiconductor materials, such as silicon (Si), CCD structures can be constructed that use the entire bulk of the semiconductor for charge generation, storage, and transfer. The 3D-CCD offers a vast improvement over CCD structures that primarily use only the surface of the semiconductor substrate. The basic structure or architecture of the 3D-CCD is the formation of deep (buried) parallel (bulk) electrodes in the substrate material which are electrically connected to surface electrodes, there being four (4) electrodes for each pixel, for example, and an E-field parallel to the surface is established within each pixel. This E-field attracts charge to the buried bulk electrodes independent of depth, and confines it within the pixel in which it was generated. Using backside illumination, the 3D-CCD structure enables a single device to image photon energies from the visible, to the ultra-violet and soft x-ray, and out to higher energy x-rays of 30 keV and beyond. In the 3D-CCD, charge is transferred from bulk electrode to bulk electrode within the body of the substrate using bulk mode operation. This mode of charge transport within a semiconductor is ideal since the charge never comes in contract with charge traps located at the surface.

The 3D-CCD offers imaging capabilities for industrial, scientific, and military uses by greatly improving the performance of the CCD structure or architecture. The advantages provided by the 3D-CCD include:

1. Increased spectral range: a) imaging across a broad spectrum with a single detector, and thus no longer would there be a need to have several expensive camera systems for researchers to image at various wavelengths, i.e. visible, ultra-violet, soft x-ray, and out to 30 keV and beyond, such a simple filter placed in the camera aperture with the 3D-CCD can provide selective wavelength imaging across this spectrum; and b) medical and dental x-ray imaging.

2. Thick substrate back illumination: 2) blue, ultra-violet and soft x-ray imaging with a rugged device without the need for thinning of the semiconductor material, which can be used in x-ray microscopy, x-ray and ultra-violet astronomy, and a variety of others, and is well suited for space based imaging systems because of its potential immunity to radiation damage; and b) direct imaging for phosphor replacement in image intensifier tubes and streak cameras, while substrate charge collection will improve detector lifetime by shielding the surface electrodes from the incident radiation.

3. Large full well and,dynamic range capabilities: a) imaging scenes with very high contrast ratios, such as munitions explosions, while still viewing the low light level surroundings; and b) imaging scenes with very low contrast ratios, such as x-ray images of objects where photon shot noise limits the detectable contrast with a scene.

4. Radiation tolerance: space missions require long lifetimes from the imaging detectors while operating in ionizing radiation environments, and the unique charge transfer mechanisms involved in the 3D-CCD makes this structure more radiation tolerant than the standard CCDs'.

As the process for fabricating these devices becomes refined, smaller pixel sizes can be realized and higher spatial resolution 3D-CCDs can be fabricated, opening even more opportunities for the use of this technology. The knowledge and skills gained in developing and using the process of this invention for embedding and doping electrodes and structures within an Si substrate, for example, could have enormous potential spinoffs. These include the fabrication of higher density circuitry on Si wafers for use in digital memory, microprocessors, and all forms of integrated circuit technology, each of which can benefit from the increased utilization of the semiconductor substrate.

Figure 2:
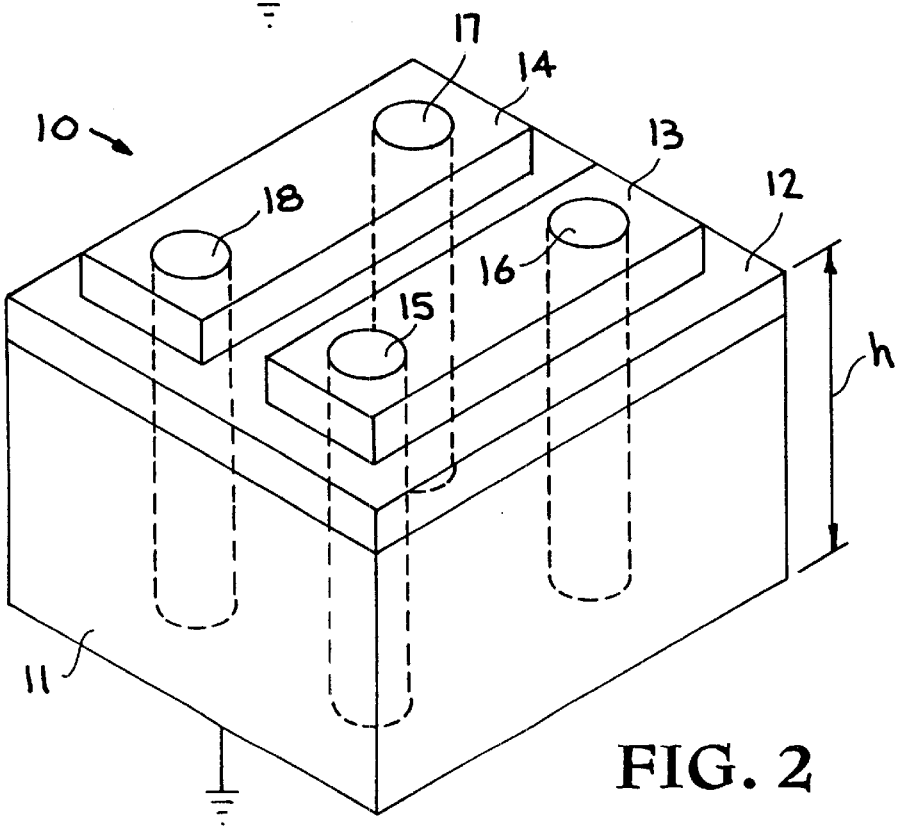
FIG. 2 schematically illustrates a 3D-CCD pixel embodiment showing the deep (buried) parallel bulk electrodes in accordance with the present invention.
Figure 1C:
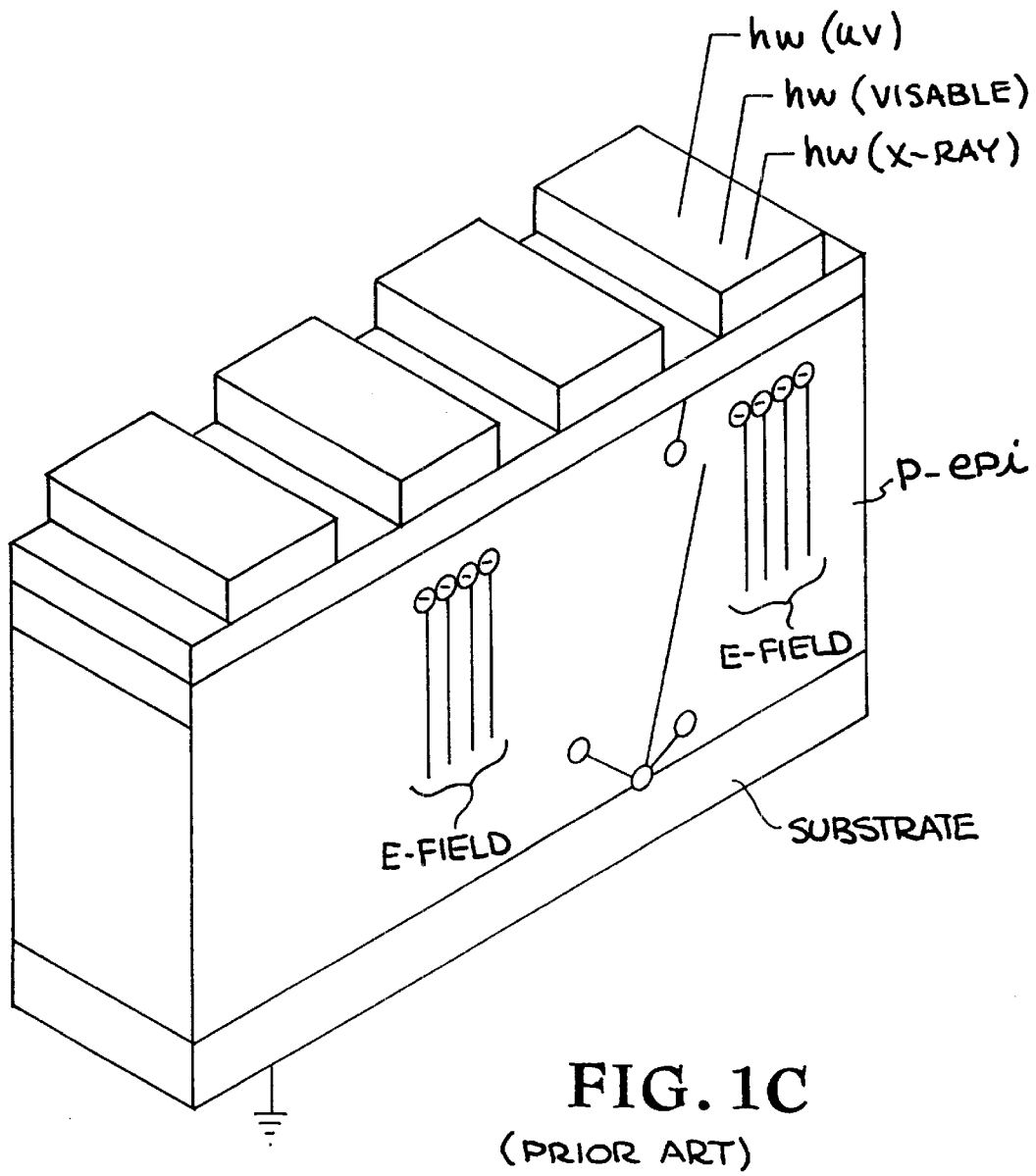
Figure 3:
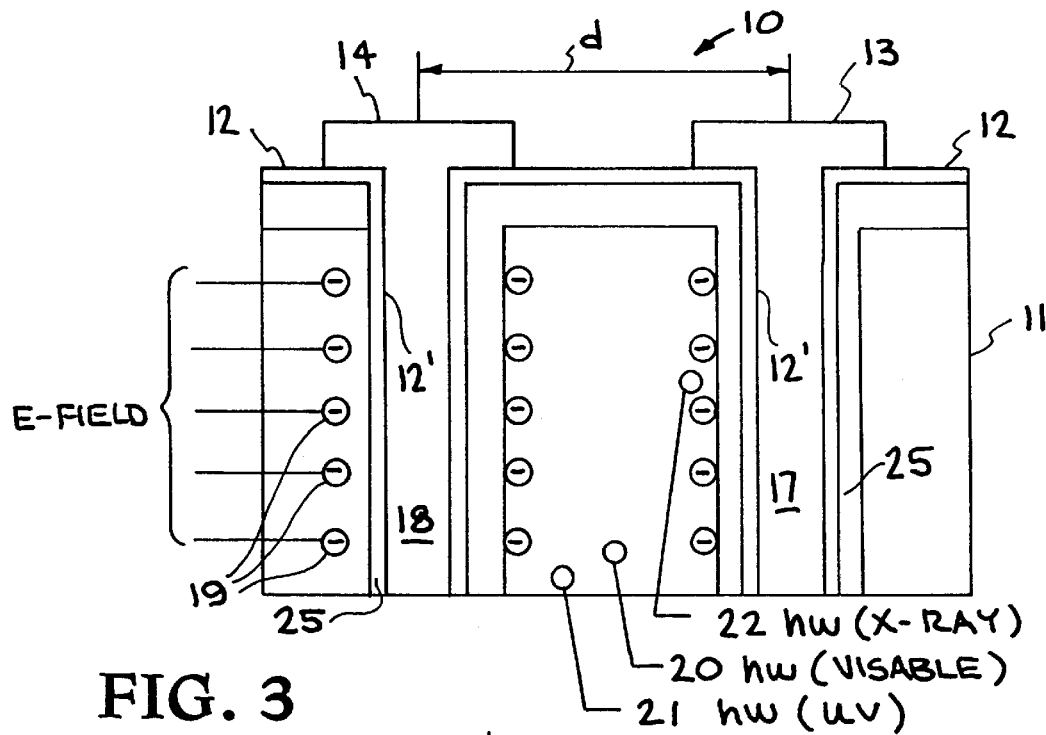
FIG. 3 is a cross-section of the FIG. 2 3D-CCD embodiment showing the E-field throughout the structure.
Figure 4:
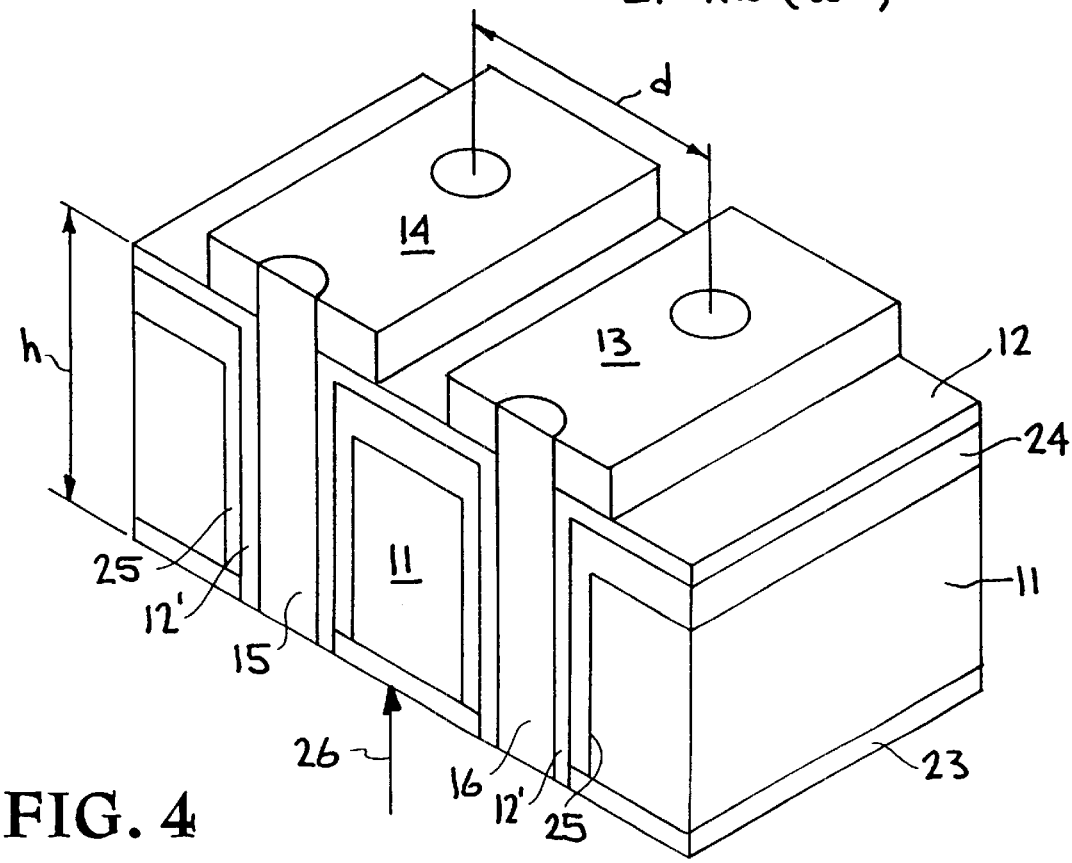
FIG. 4 is a schematic cross-sectional view of an embodiment similar to the FIG. 2 3D-CCD embodiment showing the dopant profile.

The 3D-CCD is capable of developing an electric field throughout the depth of the semiconductor by using deep buried electrodes in the substrate material, as shown in FIG. 2 comprising a 3D-CCD pixel having four (4) deep buried electrodes. The 3D-CCD pixel indicated generally at 10 comprises a substrate 11 of silicon, for example on which is secured a layer 12 of insulating (dielectric) material or oxide, such as $SiO_2$, on which is located a pair of surface electrodes 13 and 14, such as aluminum (Al) gate electrodes to each of which are connected two buried or bulk electrodes 15, 16, 17, and 18, with buried electrodes 15 and 16 electrically connected to surface electrode 13 and buried electrodes 17 and 18 electrically connected to surface electrode 14. As seen in FIGS. 3 and 4 the buried electrodes are surrounded by an $SiO_2$ layer 12'. As shown in FIG. 2, the substrate 11 has a depth or height, h, of 200 $\mu$m, the $SiO_2$ layer 12 has a thickness of 2 $\mu$m, and the surface electrodes 13 and 14 in addition to Al may be composed of gold (Au), silver (Ag), or tin (Sn) with a thickness of 0.5–1.5 $\mu$m. The buried or bulk electrodes 15–18 have, for example, a diameter of 10 $\mu$m are separated by a space of 20 $\mu$m, and may be composed of Al, Au, Ag, or Sn. As illustrated in FIG. 2, a –12 V is applied to the surface electrodes and the 3D-CCD is electrically grounded as indicated.

FIG. 3 is a cross-section illustration of the FIG. 2 3D-CCD pixel showing the electric field (E-field) throughout. The E-field, generally indicated at 19 extends essentially from the top surface to the bottom surface of substrate 11, and due to the buried electrodes 15–18, with backside illumination, a single device can image photon energies for the near IR to the visible, indicated at 20, to the ultra-violet and soft x-ray, indicated at 21, to higher energy x-rays of 30 keV and beyond, indicated at 22. As clearly shown in FIG. 3, insulating (dielectric) or oxide layer, such as $SiO_2$, extends around the buried electrodes, as indicated at 12', and are connected to layer 12 or $SiO_2$. The distance, d, between the centers of electrodes 17 and 18 is shown as 20 $\mu$m.

FIG. 4 is a cross-sectional view of an embodiment similar to the FIG. 2 3D-CCD pixel embodiment showing the basic dopant profile. The FIG. 4 device differs from FIG. 2, by that addition of p+ doped enhancement layer 23 at the lower surface and an n+/p doped antibloom layer 24 at the upper surface of substrate 11. Components similar to those of FIGS. 2 and 3 have been given corresponding reference numerals. As seen in FIG. 4, the dopant of the substrate 11 is p–, a dopant of a channel layer 25 around insulating layer 12' is n. The backside incident radiation is indicated by the arrow 26. The doping of the components of FIG. 4 will be described hereinafter in the description of the process for fabricating the 3D-CCD. As seen in FIG. 4 charge is generated in the p– substrate 11 when radiating 26 is incident thereon via the photoelectric effect, and is stored in the n channel layer 25 along the length of the cylindrical buried electrode structures 15 and 16. The charge is transferred out of the device through charge coupling from one buried electrode to the next as described hereinafter. For example, the layer 23 may be composed of boron (B) with a thickness of ~50 Å; and the layer 24 composed of n+ top layer of phosphorus (P) ~1000 Å thick and P bottom layer of boron (B) diffused to a depth of ~1–2 Å $\mu$m. The n+ layer 24 is connected to a positive voltage and acts as a conductor spreading this voltage across the surface of the device. Electrons leave the n regions surrounding the buried electrodes and move into the n+ layer, due to the positive voltage. This depletes the semiconductor of its majority carriers, which sets up the internal electric fields. The p layer interacts with the n layer surrounding the buried electrode to form an n– region between the n+ layer and the n region. This n– region forms a potential barrier, limiting the total number of majority charge carriers (electrons) that can leave the n region and enter the n+ region.

The remaining charge is removed from the n region via the charge readout process described. Once all the charge has been removed, the device is fully depleted and ready to operate.

The amount of charge that can accumulate in the n region is controlled by the n– potential barrier. If too much charge accumulates it will spill over into the n+ layer. This is known as antiblooming. (One beauty of this method is that the antiblooming region is removed from the charge collection region and therefore doesn't interfere with the quantum detection efficiency.)

Figure 5:
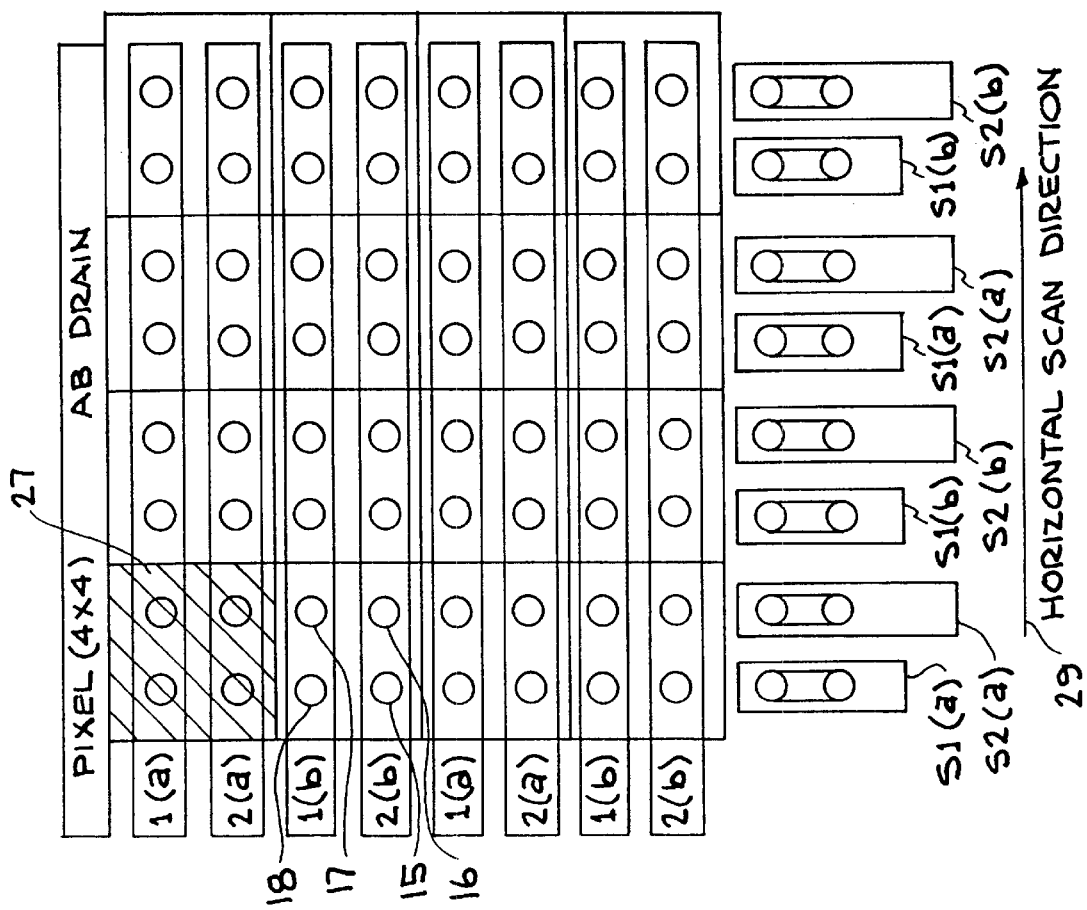
FIG. 5 schematically illustrates a topside structure of 4×4 pixel 3D-CCD, utilizes the pixels of the FIG. 2 3D-CCD.
Figure 5:
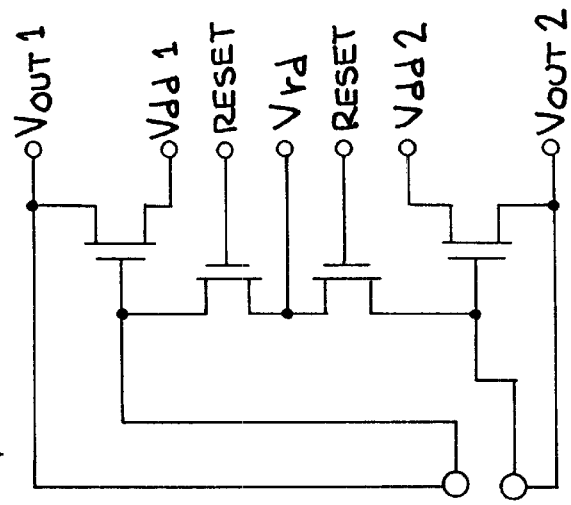

The basic construction or architecture of the 3D-CCD is shown in FIGS. 2, 4, and 5. FIG. 5 illustrates a layout of a hypothetical 4×4 pixel 3D-CCD. The topside structure is very similar to conventional CCDs. The circles show the positions of the bulk or buried electrodes 15–18 in each pixel indicated at 27, with the components 51(*a*), 52(*a*), 51*b*, 52*b* illustrating surface channel connects to the buried electrodes of pixels having corresponding numbers to allow charge sharing. Arrows 28 and 29 indicate the vertical scan direction and the horizontal scan direction. The bulk or buried electrodes 15–18 of each pixel 27 are electrically connected to surface electrodes 13 and 14, and an electric field 19 parallel to the surface of substrate 11 is established within each pixel. This E-field attracts charge to the buried electrodes independent of depth, and confines it within the pixel in which it was generated. Charge diffusion is greatly reduced because the E-field is strong due to the proximity of the buried electrodes.

Figure 6:
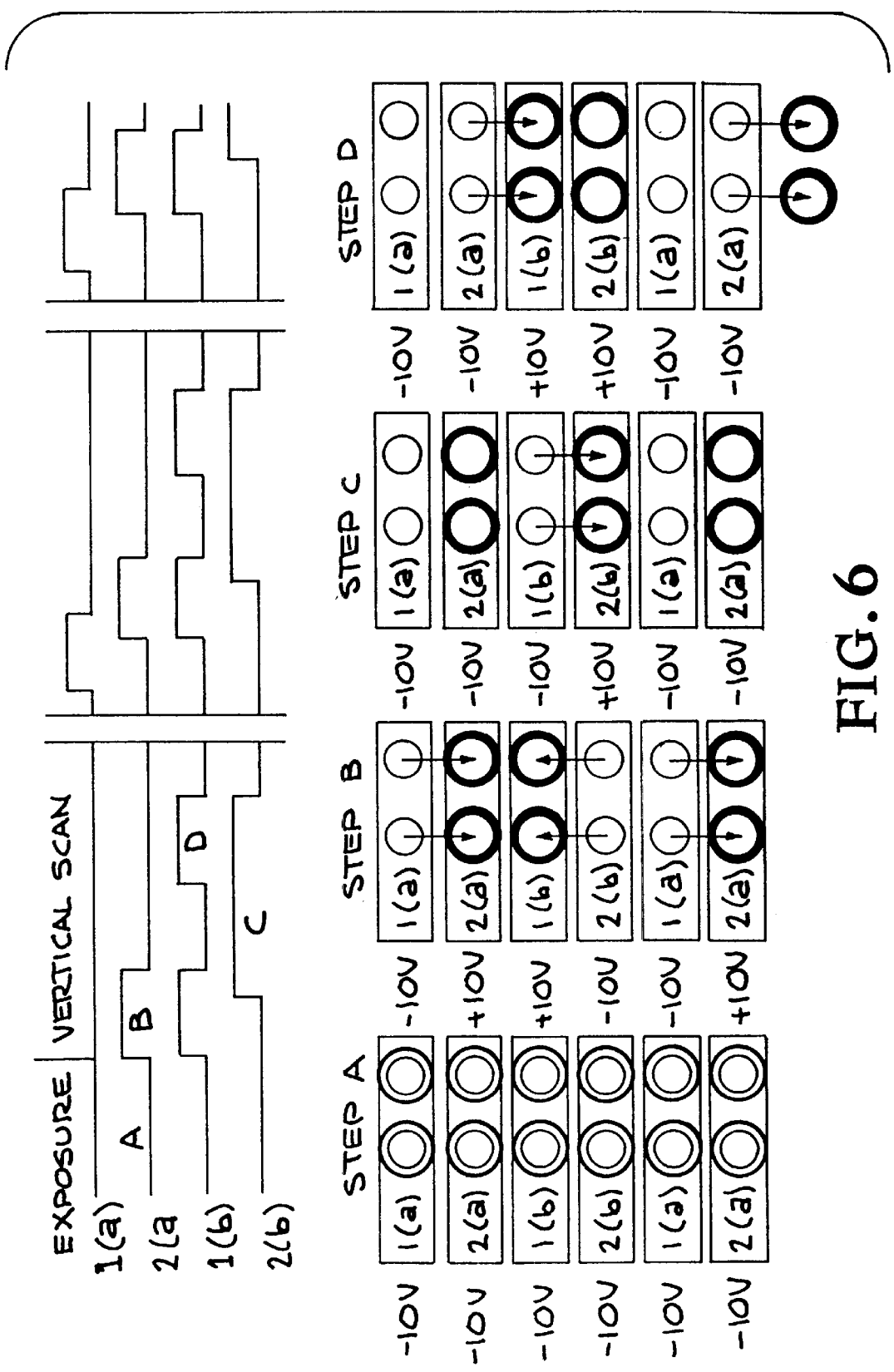
FIG. 6 illustrates a vertical scan sequence for a 3D-CCD.

The operation of the 3D-CCD is similar to that of typical CCD devices. Charge is transferred from buried electrode to buried electrode within the silicon. This mode of change transport within a semiconductor is ideal since the charge never comes in contact with charge traps located at the surface, as discussed above. FIG. 6 shows the suggested clock sequence to scan charge in the vertical direction (see arrow 28 of FIG. 5) from the 3D-CCD. During exposure charge is collected along the length of each buried electrode. At the end of exposure, the accumulated charge packets within a pixel are summed to form two charge packets. These packets are then shifted toward the horizontal scan register.

Figure 7:
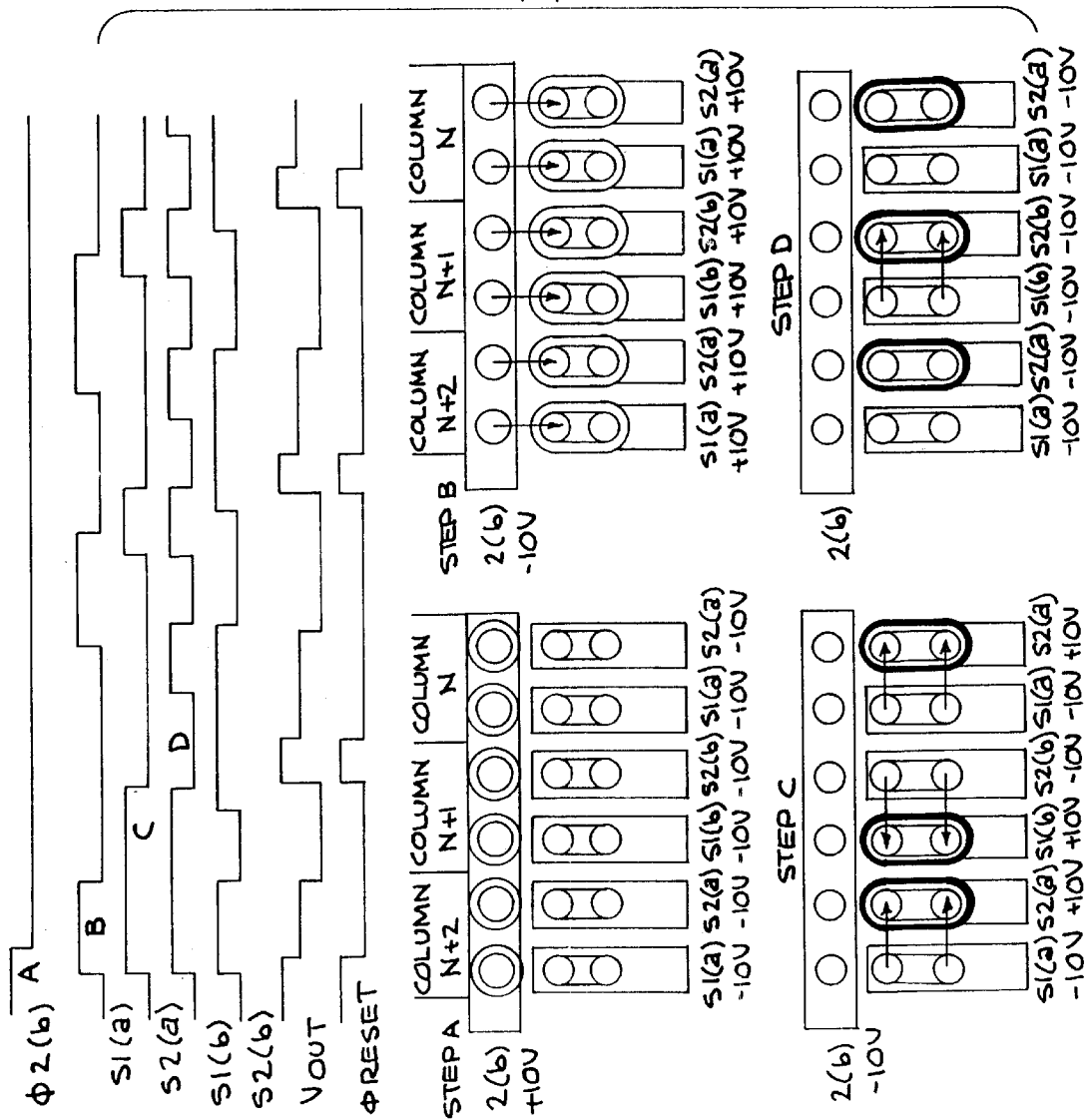
FIG. 7 illustrates the charge transfer in the 3D-CCD, wherein the clock phases are pulsed in sequence to move the charge pockets through the semiconductor.

At the horizontal register, the charge packets from a pixel are summed to form a single packet, as shown in FIG. 7. The charge packets are then shifted to the output amplifier stage. Two output amplifiers (see FIG. 5) are used to accommodate the large charge handling capacity of this device. Signal charge is split equally between the two amplifiers whose outputs can be summed back together to form a large composite signal.

The clock sequence can be modified to provide two fields separated by ½ pixel in both the vertical and horizontal directions, as shown by the pixel arrangement and indicated by arrows 28 and 29 in FIG. 5. This provides a composite image with twice the number of pixels in both directions with a dithered pixel position, increasing the resolution of the device.

It is thus seen that the buried electrodes 15–18 are electrically connected to the surface electrode 13 and 14 of each pixel 27, and an electric field 19 parallel to the surface of the substrate 11 is established within the material of the substrate. This electric field attracts charge to the buried electrodes independent of depth and confines it within the pixel in which it was generated. Charge spreading is greatly reduced because the electric field across the entire pixel throughout the depth of the material due to the proximity of the buried electrodes. In addition, the electrodes of the 3D-CCD are Al, for example, and not poly-Si, and this reduces the resistance along the electrode layer considerably, increasing the bandwidth at which the electrodes can be driven. This improves the uniformity of the full well capacity across the device when high clock rates are used to scan the charge out of the device. An additional benefit in the structure of the electrode is the elimination of electrode overlap. This reduces interelectrode capacitance and reduces the probability of interelectrode shorts during the fabrication process.

Quantum Detection Efficiency

Quantum efficiency (QE) is the measurement of how effectively incident photons are detected and is a function of photon wavelength (energy). The QE is reduced at various wavelengths because photon penetration may be too great, electrode and oxide structures block the incoming photons, or photons may reflect away at the semiconductor surface. These factors contribute to reducing the QE of a detector to less than 100%.

Figure 8:
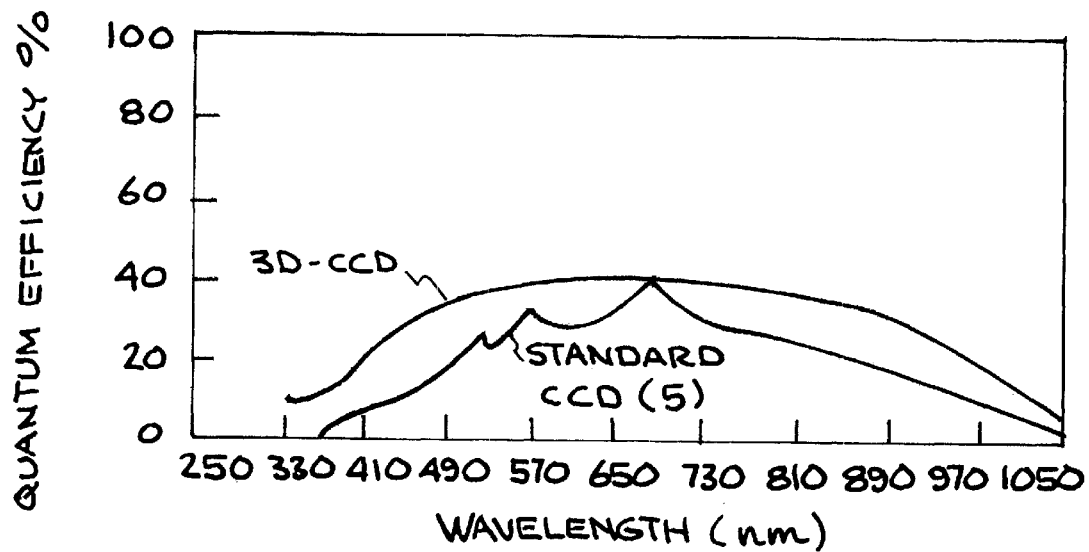
FIG. 8 illustrates the spectral response (QE) of the 3D-CCD compared to that of a front illuminated standard CCD in the visible and near IR spectrum.

The QE of the 3D-CCD, see FIG. 8, shows an extended response in the blue (visible) and near IR compared to that of a typical front illuminated CCD because of an absorbing electrode and oxide layer at the imaging interface. The QE of the 3D-CCD in the blue is less than that of a back thinned CCD because of an 80% fill factor, as opposed to 100%, and no AR coating has been calculated into the response for the 3D-CCD. The near IR response of the 3D-CCD has increased because of its greater collection depth.

Figure 9:
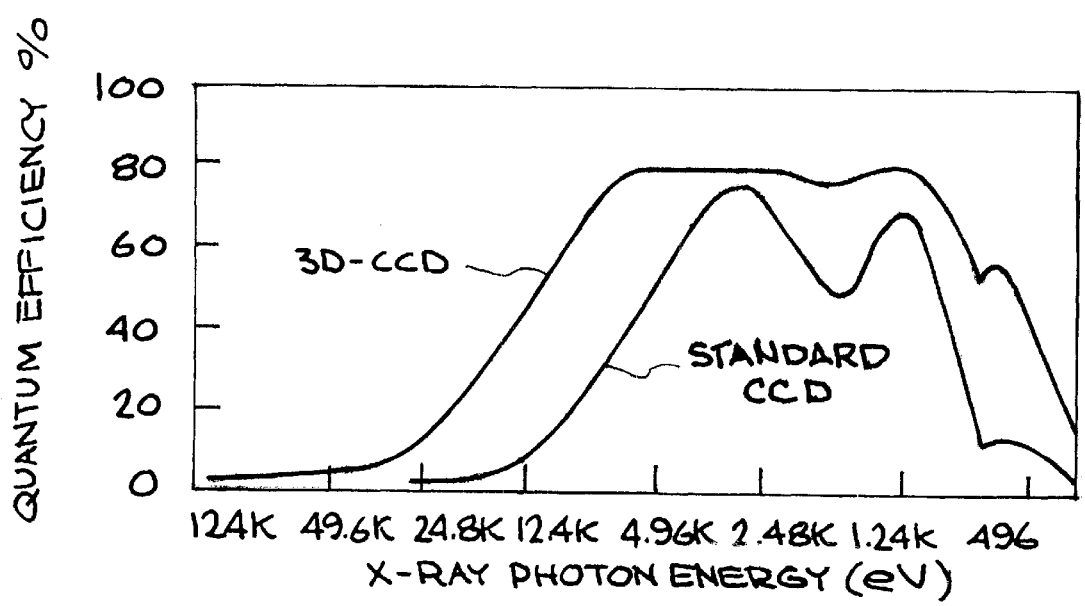
FIG. 9 illustrates the QE of the 3D-CCD (200 $\mu$m) extended across the higher energy x-ray spectrum, compared to the standard CCD.

The predicted x-ray response for the 3D-CCD as shown in FIG. 9 and compared to a standard CCD, is extended because of the 200 $\mu$m active collection depth of the 3D-CCD. The predicted QE of the 3D-CCD is also high at XUV energies or a few hundred eVs, again due to the lack of absorbing electrode structures. In addition a p+ enhancement layer (see FIG. 4) is used to improve the QE at XUV energies (also improves the QE for direct electron detection) where absorption occurs directly below the surface of the semiconductor.

Modulation Transfer Function (MTF)

The modulation transfer function (MTF) is the measurement of how well the detector responds to fine spatial detail within an image. In general the MTF (geometry) of the detector depends on the pixel patch, W, and the spatial frequency, $f_s$, as given by:

$$MTF(\text{geometry}) = SINC\ (Wf_s).$$

As photons penetrate deeper into the semiconductor, charge will be generated outside of the depletion regions, well below the CCD elements. This charge can diffuse sideways from the point of generation before being collected as signal. This reduces the ultimate MTF of the detector, and like the QE, is dependent upon wavelength. The resulting MTF of the detector is limited by this charge spreading effect. The MTF based upon pixel geometry and charge spreading is defined as:

$$MTF = MTF(\text{charge spreading}) \times MTF(\text{geometry}).$$

Figure 10:
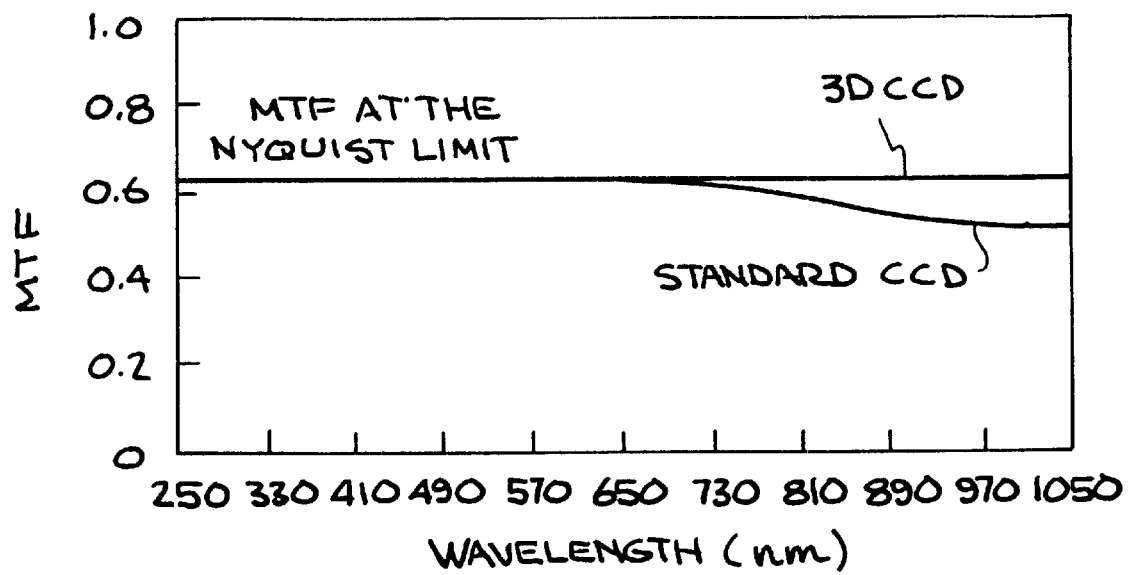
FIG. 10 illustrates the Modulation Transfer Function (MTF) for the 3D-CCD extended in the near IR spectrum, compared to the standard CCD.

The predicted MTF of the 3D-CCD remains at the Nyquist for photons at the near IR occurring with an 11° angle of the incidence with respect to the normal of the detector surface. Depending upon the epitaxial thickness and the depletion depth for typical CCDs, the MTF can be reduced below the Nyquist, forcing IR blocking filters to be included with the system in order to minimize this effect. FIG. 10 illustrates the MTF of the 3D-CCD as extended in the near IR, as compared to a Standard CCD, because of the great reduction in charge spreading in the 3D-CCD structure.

Figure 11:
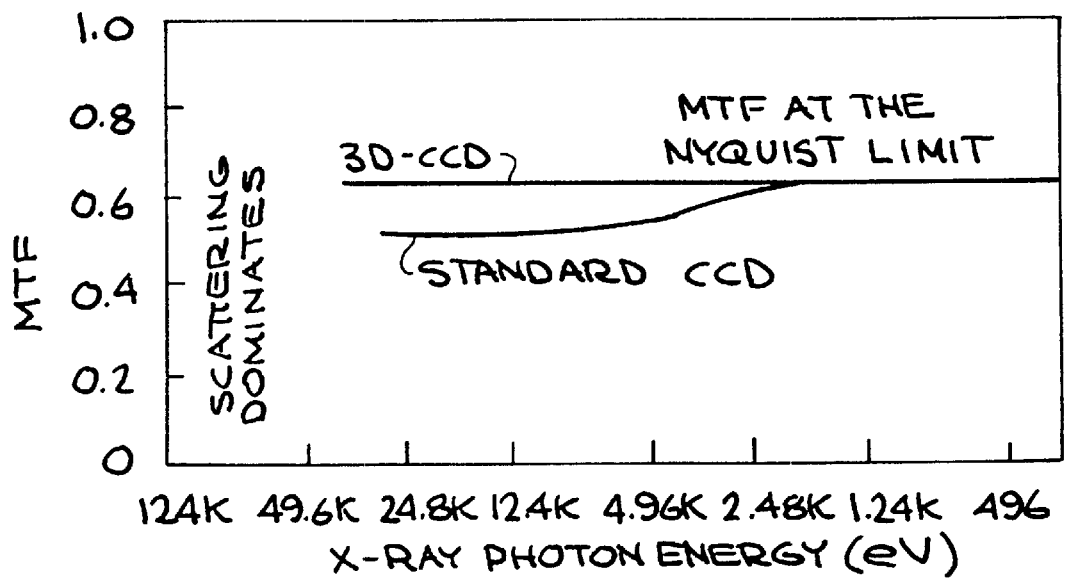
FIG. 11 illustrates the MTF of the 3D-CCD extended into the higher x-ray region, compared to the standard CCD.

The effects of scattering at higher x-ray energies has not been calculated into the MTF of either the 3D-CCD of Standard CCD detector, shown in FIG. 11, and the MTF degradation will be dominated by scattering at these higher energies. However, FIG. 11 shows the potential for the 3D-CCDs use in photon counting at higher x-ray energies where charge spreading degrades the energy measurements.

Dark Current

The buried electrodes of the 3D-CCD present a problem with respect to dark current because they increase the number of surface states within a pixel, both because they increase the surface area of the oxide interface, and because of the ill-defined crystallographic orientations around the circumference of the electrode. Applying a sufficiently negative gate voltage, such as the −12V shown in FIG. 2, with respect to the substrate potential, will force the semiconductor surface into inversion and reduce these effects by several orders of magnitude. The 3D-CCD semiconductor surface is operated in inversion during exposure, and only comes out of inversion for a brief period during a charge transfer cycle. The total collection volume of the 3D-CCD has increased 10× when compared to conventional CCDs. This will increase the dark current contributed by bulk generation states within the device. It is predicted that from 100 pA cm$^{-2}$ to 10 nA cm$^{-2}$ should be expected for the 3D-CCD with a 200 μm depletion depth.

Full Well Capacity

The full well capacity of the 3D-CCD is defined as the maximum amount of charge (electrons) that can be transported through the device. Typical full well capacities of standard CCDs range from 100 K electrons to 2×10$^6$ electrons. The 3D-CCD has very large well capacities because of the storage area formed by the buried electrodes. A full well capacity of a pixel was calculated for a 200 μm thick substrate and 10 μm diameter buried electrode to be:

$N_{full} \approx 16 \times 10^6$ electrons/pixel.

With the correct amplifier design, CCDs exhibit inherently low noise. Typical rms noise of less than ten electrons can be achieved for systems cooled to −30° C. The signal to noise ratio (SNR) of the 3D-CCD architecture can be enormous:

$SNR_3$D-CCD=$N_{full}$/rms noise=16×10$^6$/10=1.6×10$^6$:1 or 124 dB.

By increasing the thickness of the substrate and depth of the buried electrode, the full well capacity and SNR can be increased accordingly. A 1 mm long buried electrode could produce well capacities of 200×10$^6$ electrons and an SNR of 146 dB.

A new output stage MOSFET design to accommodate this large of dynamic range may be required, possibly by using a distributed floating gate amplifier (DFGA) output stage. Each amplifier can have a different sensitivity to cover a particular dynamic range.

The 3D-CCD performance shows great promise since the predicted CTI remains low after radiation exposure. This makes the 3D-CCD a possible candidate for deep space applications where high radiation backgrounds can be experienced. Other radiation effects on charge coupled devices include increased dark current and fixed pattern noise. It is unclear at this time if the 3D-CCD will be less susceptible to these effects of radiation damage. Certainly cooling any charge coupled device can eliminate the increase in dark current, and this remains true for the 3D-CCD.

It is interesting to note that the increased 3D-CCD can also occur from low quality semiconductor substrates or process contamination. The high performance still achieved by the 3D-CCD, even with a lowered $\tau_s$, may make it more tolerant to semiconductor and fabrication defects.

Fabrication Processes

The following sets forth an example of specific operational steps which may be utilized for fabricating the embodiment of the 3D-CCD illustrated in FIG. 2. While the steps outlined below involve a chemical etching process, it should be noted that plasma etching is a viable alternative. This example process is outlined as follows:

Step I: Substrate material, p-type 75 Ω cm, boron doped Si, with a <100> surface cut.

Step II: A Si$_3$N$_4$ mask is laid over the surface of the substrate.

Step III: An array of holes where the bulk electrodes are to be formed, is etched from the Si$_3$N$_4$ mask using standard techniques.

Step IV: Aluminum is deposited over the mask, making contact with the Si substrate through the etched holes in the mask.

Step V: The substrate is baked from the backside, generating a vertical thermal gradient. The highly directional diffusion of Al is Si follows this thermal gradient, forming vertical columns of Al doped Si within the substrate. The diameter of these columns should be approximately 10 μm, to a depth of 200 μm.

Step VI: The mask and aluminum are removed from the substrate, and chemical etching of the Al doped Si is accomplished. The Si substrate now has an array of holes within its bulk.

Step VII: Applying positive gas pressure at the Si substrate using phosphine gas (PH$_3$), forces the phosphine into the narrow etched holes. At the same time, the substrate is baked to drive the phosphorus into the walls of the holes, forming an n-region.

Step IX: The phosphine gas is evacuated, and H$_2$O steam is driven through the etched holes to form a thin oxide layer along their surface.

Step X: Aluminum in either a molten or vapor phase may be driven through the holes using positive pressure to form a metalization at the surface of the holes, forming the bulk electrode structure.

Step XI: The top and bottom surfaces of the substrate are cleaned and readied for surface electrode placement.

At this point the 3D-CCD can be processed using standard techniques to form the surface electrode structure and active output devices as in a standard CCD fabrication process.

The embodiment of FIG. 4 differs from that of FIG. 2 by the addition of the p+ enhancement layer 23 and the n+/p antibloom layer 24 formed on the bottom and top surfaces of the substrate 11.

Formation of the buried electrode structures of FIG. 4 involves using state-of-the-art semiconductor etching techniques, specifically anisotropic thermal migration of Al in Si. The first step requires the formation of cylindrical holes within the semiconductor material at the position of the buried electrodes. A high quality, 200 μm thick, lightly doped (<50 Ω cm) p type Si substrate is used as the base material (maybe a 200 μm thick epi could be grown on a suitable substrate after which the substrate material could be removed leaving behind the epitaxial layer for electrode placement). A Si$_3$N$_4$ mask is formed on the surface of the substrate and holes are etched from the mask layer at the position of each buried electrode. Next, Al is deposited over the mask layer, coming in contact with the Si at the holes in the mask. The substrate is heated from the backside, causing the Al to anisotropically migrate to the heat source. Aspect ratios of better than 20:1 can be achieved by this technique. This process is continued until a column of Al doped Si is formed within and extending through the substrate. The Si$_3$N$_4$ mask is removed and the substrate placed in an acid bath to remove the Al doped Si, forming holes within the material at the position of the buried electrodes.

The next step requires the formation of a channel along the length of the cylindrical holes. This channel is n type and is formed by placing the substrate into a stream of phosphine gas (PH$_3$) at high temperature. The phosphorus diffuses into the wall of the cylindrical holes. The substrate is then baked to drive in the phosphorus and form an n type channel.

After the channel has been formed the walls of the cylindrical holes are exposed to O$_2$ to form an oxide and finally Al is driven into the holes to form the complete MOS electrode.

The n+/p antibloom layer 24 can be formed on the top surface of the substrate 11 using standard ion implantation techniques followed by annealing. This is also true for the p+ enhancement layer 23 which can be formed using one of several techniques.

The remainder of the fabrication of the 3D-CCD involves techniques developed for the deposition of structures on the surface of the semiconductor.

It has thus been shown that the present invention provides a 3D-CCD and process for fabricating same which offers imaging capabilities for industrial, scientific, and military use by greatly improving the performance of the CCD architecture. The 3D-CCD provides the following advantages:

Increased Spectral Range

1. A single detector can now image across a broad spectrum. No longer is there a need to have several expensive camera systems for researchers to image at various wavelengths, i.e., visible, ultra-violet, soft x-ray, and out to 30 keV and beyond. A simple filter placed in the camera aperture with the 3D-CCD can provide selective wavelength imaging across this spectrum.

2. Medical and dental x-ray imaging. Table III sets forth the spectral range of various CCD architectures and the spectral range of a 200 µm thick 3D-CCD.

TABLE III

| 3D-CCD |
|---|
| Thinned, back illuminated CCD |
| Front illuminated CCD |
| Deep depletion CCD |
| near IR  Visible  UV  XUV  1 keV  10 keV  30 keV |
| ——— x-ray ——— |

Thick Substrate Back Illumination

1. Blue, ultra-violet, and soft x-ray imaging with a rugged device without the need for thinning of the semiconductor material. Uses include x-ray microscopy, x-ray and ultra-violet astronomy [10], and a variety of others. The 3D-CCD is particularly well suited for space based imaging systems because of its potential immunity to radiation damage.

2. Direct electron imaging for phosphor replacement in image intensifier tubes and streak cameras. Thick substrate charge collection will improve detector lifetime by shielding the surface electrodes from the incident radiation.

Large Full Well and Dynamic Range Capabilities

1. Imaging scenes with very high contrast ratios, such as munitions explosions, while still viewing the low light level surroundings.

2. Imaging scenes with very low contrast ratios, such as x-ray images of objects where photon shot noise limits the detectable contrast within a scene.

Radiation Tolerance

Space missions require long lifetimes from the imaging detectors while operating in ionizing radiation environments. The unique charge transfer mechanisms involved in the 3D-CCD appears to make this architecture more radiation tolerant than standard CCDs but has not been experimentably verified. See Table IV below:

TABLE IV

|  | 3D-CCD | Front Illuminated | Back Illuminated |
|---|---|---|---|
| Full well capacity | $16 \times 10^6$ electrons | $3 \times 10^6$ electrons | $3 \times 10^6$ electrons |
| Dark current 20° C. | 10k e-/pixel/sec | 100k e-/pixel/sec | 100k e-/pixel/sec |
| SNR | 124 dB | 110 dB | 110 dB |

As the techniques used in the above-described 3D-CCD fabrication processes become refined, smaller pixels can be fabricated and thus higher spatial resolution 3D-CCDs can be produced, thereby further advancing the state-of-the-art.

While particular embodiment of the device and process along with specific materials and parameters have been set forth to exemplify and explain the principles of the invention, such are not intended to be limiting. Modifications and changes may become apparent to those skilled in the art, and it is intended that the invention be limited only by the scope of the appended claims.

What is claimed is:

1. In a process for fabricating a charge coupled device, the improvement including:
    forming holes through a substrate,
    forming a channel layer in each of the holes,
    forming a plurality of spaced buried electrodes extending through the holes, and
    forming an oxide layer intermediate the channel layer and the buried electrode in each of the holes in the substrate.

2. The process improvement of claim 1, additionally including forming an oxide layer on a surface of the substrate, and forming at least a pair of surface electrodes on the oxide layer, connecting the oxide layers in the holes of the substrate with the oxide layer on the surface of the substrate, and connecting the buried electrodes to the surface electrodes.

3. The process improvement of claim 2, additionally including providing an antibloom layer intermediate the substrate and the oxide layer on the surface thereof, and providing an enhancement layer on a surface of the substrate opposite the oxide layer thereon.

4. The process improvement of claim 1, wherein the holes are formed of closed configuration and extend through the substrate.

5. The process improvement of claim 1, wherein forming the buried electrodes in the holes is carried out by forming two buried electrodes, and additionally including forming at least one surface electrode, and connecting the two buried electrodes to the surface electrode.

6. The process improvement of claim 1, wherein forming the buried electrodes in the holes is carried out by forming two pair of buried electrodes, and additionally including forming a plurality of surface electrodes, and electrically connecting each pair of buried electrodes to a surface electrode, thereby forming a pixel including two surface electrodes and two pairs of buried electrodes.

7. The process improvement of claim 6, additionally including connecting a plurality of pixels to a plurality of outputs.

8. The process improvement of claim 1, wherein the plurality of electrodes are formed to have a diameter of about 10 µm and a length of about 200 µm.

9. The process improvement of claim 8, additionally including providing the substrate with a thickness of about 200 μm.

10. The process improvement of claim 1, additionally including forming an oxide layer on the substrate, and forming at least one surface electrode on the oxide layer, and connecting the oxide layers around the buried electrodes to the oxide layer on the substrate.

11. The process improvement of claim 10, additionally including forming an antibloom layer intermediate the substrate and the oxide layer on the substrate.

12. The process improvement of claim 10, additionally including forming an enhancement layer on a surface of the substrate opposite the oxide layer on the substrate.

13. The process improvement of claim 1, additionally including forming an antibloom layer and an enhancement layer on opposite surfaces of the substrate and around the buried electrode.

14. The process improvement of claim 1, wherein the plurality of buried electrodes are formed to extend at least through the substrate.

15. The process improvement claim 1, additionally including forming the substrate of p-type material, forming channel layers in the plurality of holes of n type material, and forming the buried electrodes of material selected form the group consisting of aluminum, gold, silver, and tin.

16. The process improvement of claim 10, wherein the substrate is formed of p-silicon, the oxide layers are formed of $SiO_2$, and the buried electrodes and surface electrodes are formed of aluminum.

* * * * *